United States Patent
Olson

(10) Patent No.: US 9,269,538 B2
(45) Date of Patent: Feb. 23, 2016

(54) ION BEAM UNIFORMITY CONTROL USING ION BEAM BLOCKERS

(71) Applicant: Varian Semiconductor Equipment Associates, Inc., Gloucester, MA (US)

(72) Inventor: Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/221,840

(22) Filed: Mar. 21, 2014

(65) Prior Publication Data

US 2015/0270099 A1    Sep. 24, 2015

(51) Int. Cl.
*G21K 5/00* (2006.01)
*H01J 37/30* (2006.01)
*H01J 37/317* (2006.01)

(52) U.S. Cl.
CPC ......... *H01J 37/3007* (2013.01); *H01J 37/3171* (2013.01); *H01J 2237/04* (2013.01); *H01J 2237/08* (2013.01); *H01J 2237/303* (2013.01)

(58) Field of Classification Search
USPC ...................................... 250/396 R
See application file for complete search history.

(56) References Cited

U.S. PATENT DOCUMENTS

| 5,350,926 | A | 9/1994 | Renau et al. |
| 7,547,460 | B2* | 6/2009 | Cucchetti ............ H01J 37/1474 250/396 R |
| 2008/0169435 | A1* | 7/2008 | Sakase et al. ............ 250/492.21 |
| 2012/0056107 | A1 | 3/2012 | Distaso et al. |
| 2012/0056110 | A1* | 3/2012 | Distaso ............... H01J 37/3026 250/492.21 |

OTHER PUBLICATIONS

Purser, Kenneth H., et al., Dual Mode Ion Implanter, U.S. Appl. No. 14/163,844, filed Jan. 24, 2014.
Purser, Kenneth H., et al., Dual Mode Ion Implanter, U.S. Appl. No. 14/163,833, filed Jan. 24, 2014.
Purser, Kenneth H., et al., Dual Mode Ion Implanter, U.S. Appl. No. 14/163,814, filed Jan. 24, 2014.

* cited by examiner

*Primary Examiner* — Phillip A Johnston

(57) ABSTRACT

A method of achieving ion beam uniformity control using ion beam blockers. The method includes generating an ion beam, detecting a current profile of said ion beam with an ion beam blocker unit, wherein said detected current profile is an initial current profile, blocking a portion of said ion beam with said ion beam blocker unit to achieve a second current profile that is different from the initial current profile, and implanting said ion beam into a workpiece after said blocking.

18 Claims, 3 Drawing Sheets

ION BEAM UNIFORMITY CONTROL USING ION BEAM BLOCKERS

FIELD OF THE DISCLOSURE

This invention relates to ion implantation and, more particularly, to an apparatus and method for improving the uniformity of an ion beam used for ion implantation.

BACKGROUND OF THE DISCLOSURE

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

In one instance, a ribbon ion beam is used to implant the workpiece. A ribbon ion beam cross-section has a long dimension and a short dimension. The long dimension, for example, may be referred to as a width or x-direction, though other orientations are possible. The ribbon ion beam may be formed using a parallelizing lens or may be a scanned spot beam.

Occasionally, the ribbon ion beam may not be perfectly uniform. In the case where the ribbon beam is a scanned spot beam, non-uniformities in the ribbon are typically minimized by scanning the spot beam entirely or almost entirely off of the workpiece and by adjusting the time dependence of the scanning of the spot. However, under some circumstances, for instance when the spot beam current is large or the beam energy is small, it is common for the spot size of the ion beam to increase. The requirement of scanning the spot beam entirely or nearly entirely off the workpiece has the consequence that, for a large spot beam, relatively little beam current is utilized on the workpiece, which reduces the productivity of the implanter. The technique of minimizing non-uniformities by adjusting the time dependence of the scanning of the spot is known to be more complicated and less likely to succeed as the spot size increases.

Ribbon ion beam uniformity is one factor that affects implantation. Non-uniform ribbon ion beams may result in imprecise doping or implantation. For example, more heavily-doped stripes may be formed on the surface of a workpiece. An incorrect dose may cause deleterious yield effects if the devices are non-functioning due to the increased or decreased dose. Therefore, there is a need in the art for uniformity during implantation and, more particularly, uniformity during implantation on scanned spot beam implanters. It is with respect to these and other considerations that the present improvements have been needed.

SUMMARY

An exemplary method of achieving ion beam uniformity control using ion beam blockers in accordance with the present disclosure may include the steps of generating an ion beam, detecting a current profile of said ion beam with an ion beam blocker unit, wherein said detected current profile is an initial current profile, blocking a portion of said ion beam with said ion beam blocker unit to achieve a second current profile that is different from the initial current profile, and implanting said ion beam into a workpiece after said blocking.

A first exemplary embodiment of an ion implanter in accordance with the present disclosure may include an ion source that generates an ion beam, a scanner downstream of said ion source, an end station downstream of said scanner, and an ion beam blocker unit positioned between said scanner and said angle corrector magnet, said ion beam blocker unit configured to block a portion of said ion beam.

A second exemplary embodiment of an ion implanter in accordance with the present disclosure may include a platen, a plurality of blockers upstream of said platen, a scanner upstream of said plurality of blockers, a plurality of drive units, each of said drive units connected to one of said plurality of blockers and configured to translate one of said blockers in a first direction.

DETAILED DESCRIPTION

Figure 1:
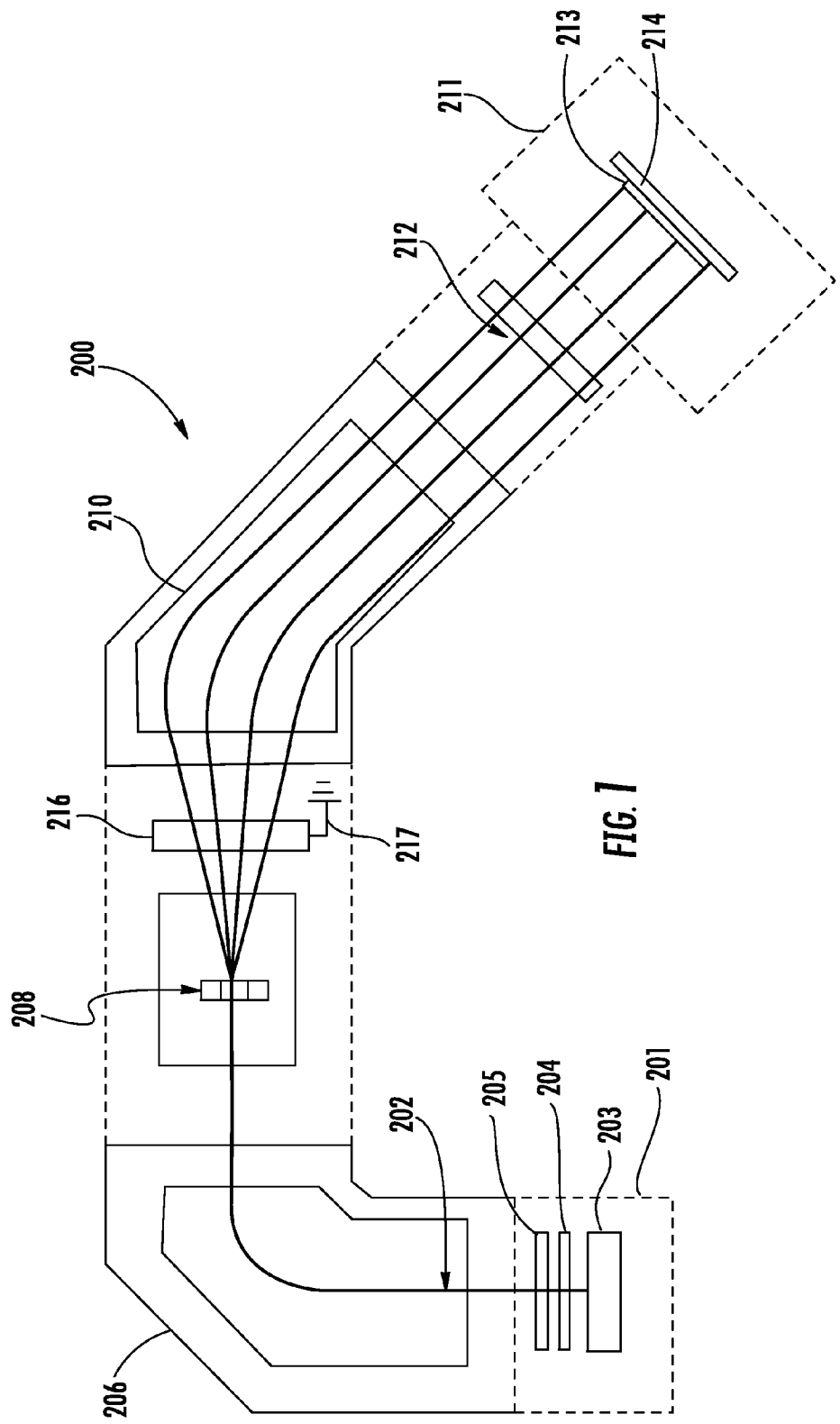
FIG. 1 is a schematic diagram illustrating a beam-line ion implanter in accordance with an embodiment of the present disclosure.

An apparatus and method for improving the uniformity of an ion beam using mechanical blockers in accordance with the present disclosure will now be described more fully hereinafter with reference to the accompanying drawings, in which preferred embodiments of the system and method are shown. The apparatus and method, however, may be embodied in many different forms and should not be construed as being limited to the embodiments set forth herein. Rather, these embodiments are provided so that this disclosure will be thorough and complete, and will fully convey the scope of the system and method to those skilled in the art. In the drawings, like numbers refer to like elements throughout.

The apparatus and method of the present disclosure are described herein in connection with an ion implanter and an associated ion implantation process. However, it is contemplated that the disclosed apparatus and method can be similarly implemented in a variety of other systems and processes, such as may be involved in the manufacture of semiconductors, for example. Additionally, while the exemplary ion implanter disclosed herein is described in connection with the implantation of semiconductor wafers, it will be understood that such disclosure is provided merely for illustrative purposes, and that the ion implanter can be similarly implemented for the implantation of other types of workpieces, including, but not limited to, solar cells, light emitting diodes (LEDs), flat panels, silicon-on-insulator (SOI) wafers, and other such components. Furthermore, while a scanned spot beam is disclosed, the embodiments disclosed herein also may be applicable to a non-scanned spot beam or a ribbon ion beam.

FIG. 1 is a schematic diagram of an ion implanter 200. Those skilled in the art will recognize that the ion implanter 200 is merely one of many examples of such implanters and alternative arrangements may be implemented. In general, the ion implanter 200 includes an ion source 201 that generates ions that form an ion beam 202 which may be an ion spot beam 202. The ion source 201 may include an ion chamber 203. A gas may be supplied to the ion chamber 203 where the gas is ionized. This gas may be or may include or contain, in some embodiments, a p-type dopant, an n-type dopant, carbon, hydrogen, a noble gas, a molecular compound, or some other species known to those skilled in the art. The ions thus generated are extracted from the ion chamber 203 to form the ion beam 202. The ion beam 202 may pass through a suppression electrode 204 and ground electrode 205 into a mass analyzer 206. The mass analyzer 206 may block undesired ion species in the ion beam 202 while allowing desired ion species to pass. The ion implanter 200 may further include a scanner 208 that is configured to receive the spot ion beam 202 and to rapidly scan the spot ion beam 202 in a direction that is orthogonal to the path of the spot ion beam 202 to form a relatively wider ribbon ion beam 212 as further described below. The scanner 208 may be an electrostatic scanner or a magnetic scanner. The electrostatic scanner may be configured to scan the spot ion beam 202 according to a predetermined and/or adjustable scanner waveform that may dictate the amount of time that the ion beam 202 is directed toward a given point or area on a workpiece as further described below. An ion beam blocker unit 216 may be positioned downstream from the scanner 208. The ion beam blocker unit 216 may be configured to selectively block portions of the scanned ion beam 202 to improve ion beam uniformity as further described below.

An angle corrector magnet 210 may be positioned downstream of the ion beam blocker unit 216 and may convert the diverging beamlets of the scanned ion beam 202 into a ribbon ion beam 212 having substantially parallel ion trajectories. An end station 211 supports one or more workpieces, such as workpiece 213, in the path of ribbon ion beam 212 such that ions of the desired species are implanted into workpiece 213. The workpiece 213 may be, for example, a semiconductor wafer. The end station 211 may include a platen 214 to support one or more workpieces 213. The end station 211 also may include a mechanical drive unit (not shown) for moving the workpiece 213 perpendicular to the long dimension of the ribbon ion beam 212 cross-section, thereby distributing ions over the entire surface of workpiece 213. It will be understood to those skilled in the art that the entire path traversed by the ion beam is evacuated during ion implantation. The ion implanter 200 may include additional components known to those skilled in the art and may incorporate hot or cold implantation of ions in some embodiments.

Figure 2:
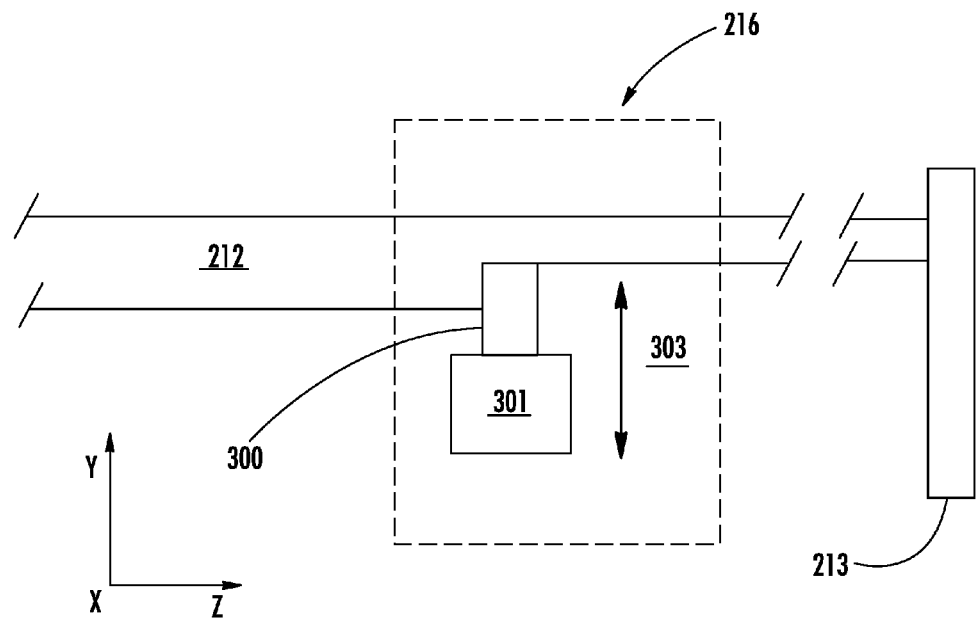
FIG. 2 is a side cross-sectional view illustrating an ion beam blocker unit in accordance with the present disclosure.

FIG. 2 is a side cross-sectional view of an ion beam blocker unit 216 (shown by the dotted line). The ion beam blocker unit 216 includes at least one blocker 300. Each blocker 300 is connected to a drive unit 301 to translate the blocker 300 in the y-direction illustrated by arrow 303. The distance the blocker 300 is translated affects how much of the ribbon ion beam 212 is blocked or trimmed. The drive unit 301 may be a piezo-electric drive or some other system known to those skilled in the art. The blocker 300 may be fabricated of graphite or some other material that does not contaminate the ribbon ion beam 212.

Figure 3:
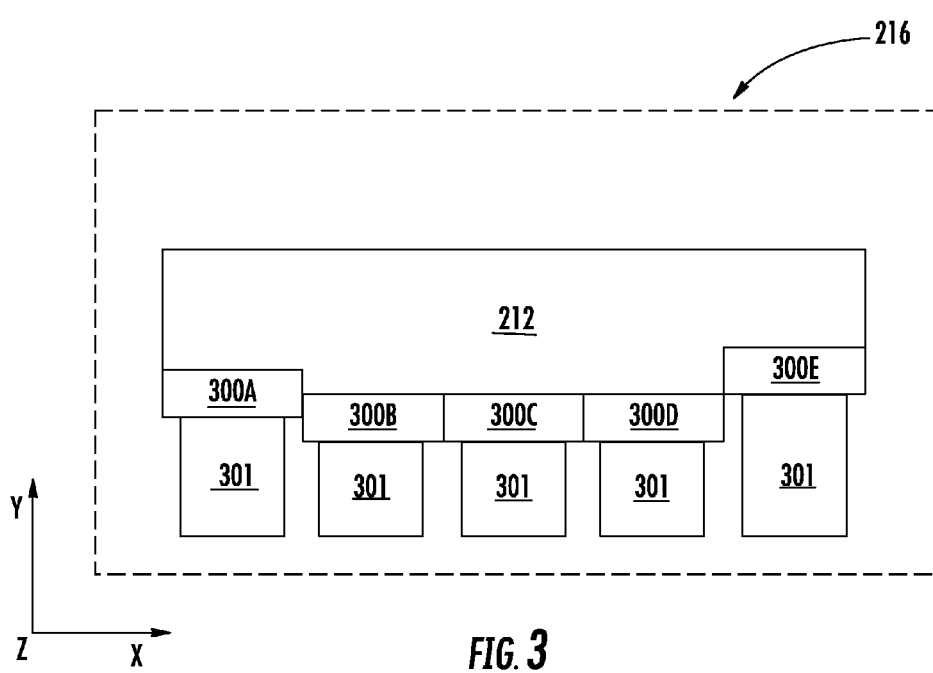
FIG. 3 is a front perspective view illustrating an ion beam blocker unit illustrated in FIG. 2.

FIG. 3 is a front perspective view of the ion beam blocker unit illustrated in FIG. 2. FIG. 3 still illustrates the ribbon ion beam 212 going in the z-direction, but now the z-direction comes out of the page. Five blockers 300A-E are illustrated in FIG. 3, but other configurations may be used and this embodiment is not solely limited to five. The blockers 300A-E may be arranged in an array. The drive units 301 translate the blockers 300A-E in the y-direction. Each blocker 300A-E may be individually translated. Thus, blocker 300E blocks or trims more of the ribbon ion beam 212 than blocker 300A, which blocks or trims more of the ribbon ion beam 212 than blockers 300B-D. The individual pattern of the blockers 300A-E depends on the non-uniformity of the ribbon ion beam 212 or how much of the ribbon ion beam 212 needs to be blocked or trimmed. The blockers 300A-E also may be translated out of the path of the ribbon ion beam 212. It may be desirable to have a ribbon ion beam 212 where the vertical integration (such as the y-direction) of the beam is the same throughout the entire ribbon ion beam 212.

A controller may be used to dictate the placement or translation of the individual blockers 300A-E to make the ribbon ion beam 212 more uniform. Such a controller may be connected to a measurement device that is configured to detect the uniformity, profile, and/or current of the scanned ion beam 202 in real time. For example, the blockers 300A-E of the ion beam blocker unit 216 may be formed of a conductive, non-contaminating material, such as graphite or doped silicon, and may be connected to a ground 217 (see FIG. 1) through current measuring electronics (not shown). The blockers 300A-E may thereby operate as sensors for detecting the current profile and the uniformity of the scanned ion beam 202 during uniformity setup by inserting the blockers completely into the beam. The beam current at each blocker position that is required to be trimmed in order to produce a uniform beam can be computed once the total current at each blocker position is known. The blockers can be then retracted by appropriate distances so that a uniform, collimated ribbon ion beam 212 is projected onto the workpiece 213.

The controller, which may be operatively connected to the ion beam blocker unit 216, may receive such information and may thereby adjust the positions of the individual blockers 300A-E in order to produce a more uniform ribbon ion beam 212 and, resultantly, more uniform ion implantation in the workpiece 213. It is further contemplated that the controller may adjust the scanner waveform (described above) in conjunction with adjusting the positions of the individual blockers 300A-E in order to produce a more uniform ribbon ion beam 212.

It has been observed that employing the ion beam blocker unit 216 in the manner described above may result in sharp or abrupt delineations in the current profile of a ribbon ion beam, such as when one of the blockers 300A-E is moved into an ion beam and an adjacent one of the blockers 300A-E is not. Such delineations may be detrimental to the quality of an implanted workpiece. The electrostatic scanner 208 may therefore be employed to deflect (i.e., dither) the ion beam 202 a small amount in order to smooth out the uniformity correction provided the blockers 300A-E. Such deflection may also be employed to make the effective width of the ion beam 202 larger in cases where the size of the ion beam 202 is smaller than the workpiece 213.

Figure 4:
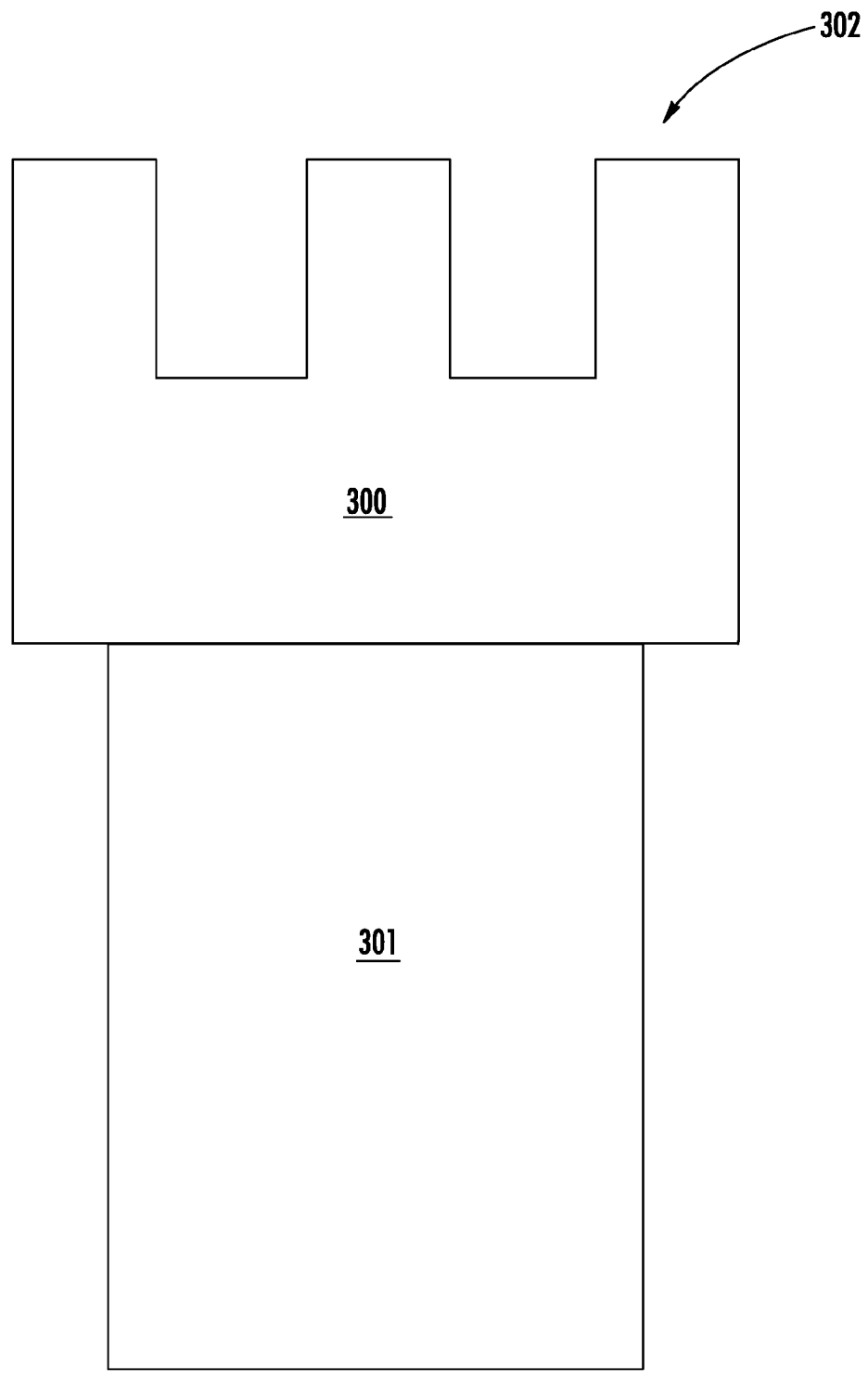
FIG. 4 is a front perspective view illustrating a second embodiment of a blocker in accordance with the present disclosure.

While rectangular blockers 300A-E are illustrated, other shapes are possible. For example, each blocker 300A-E may have multiple crenellations or teeth that can block or trim the ribbon ion beam 212. Other patterns or shapes also may be used. FIG. 4 is a front perspective view of a second embodiment of a blocker. The blocker 300 includes multiple teeth 302. Thus, each blocker 300 can block multiple portions of the ion beam.

The ion beam blocker unit 216 does not affect the angles of the ribbon ion beam 212 or the beamlets within the ribbon ion beam 212. Instead, the angles may be affected by other electrodes or magnets. Thus, the uniformity adjustment with the ion beam blocker unit 216 and any angle adjustment with electrodes or magnets may be decoupled.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method of achieving ion beam uniformity control comprising:
   generating an ion beam;
   locating an ion beam blocker unit between a scanner and an angle corrector magnet;
   detecting a current profile of said ion beam with an ion beam blocker unit, wherein said detected current profile is an initial current profile;
   blocking a portion of said ion beam with said ion beam blocker unit to achieve a second current profile that is different from the initial current profile; and
   implanting said ion beam into a workpiece after said blocking.

2. The method of claim 1, wherein said ion beam is scanned to form a ribbon ion beam with a long dimension and a short dimension.

3. The method of claim 2, wherein said second current profile is uniform across said long dimension.

4. The method of claim 2, further comprising dithering the ion beam to increase an effective width of the ion beam along the long dimension from a first width to a second width when the first width of the ion beam is smaller than the workpiece.

5. The method of claim 1, further comprising using the initial current profile to determine portions of the ion beam to be blocked with said ion beam blocker unit.

6. An ion implanter comprising:
   an ion source that generates an ion beam;
   a scanner downstream of said ion source;
   an angle corrector magnet downstream of said scanner; and
   an ion beam blocker unit disposed between said scanner and said angle corrector magnet, said ion beam blocker unit configured to detect a current profile of said ion beam and to block a portion of said ion beam based on the detected current profile.

7. The ion implanter of claim 6, wherein the ion beam blocker unit comprises a plurality of movable blockers.

8. The ion implanter of claim 7, wherein a drive unit is connected to each of said movable blockers, and wherein the drive unit is configured to translate one of said movable blockers in a first direction.

9. The ion implanter of claim 6, further comprising a controller connected to said ion beam blocker unit, said controller configured to determine a portion of said ion beam to be blocked by said ion beam blocker unit.

10. The ion implanter of claim 6, wherein said ion beam blocker unit is formed of a conductive material.

11. The ion implanter of claim 6, wherein said ion beam blocker unit is connected to ground.

12. An ion implanter comprising:
    a platen;
    a plurality of blockers disposed upstream of said platen and configured to detect a current profile of an ion bean directed toward said platen; wherein
    said plurality of blockers are located between a scanner and an angle corrector magnet; and
    a plurality of drive units, each of said drive units connected to one of said plurality of blockers and configured to translate one of said plurality of blockers in and out of a path of the ion beam based on the detected current profile.

13. The ion implanter of claim 12, wherein said plurality of blockers are configured to translate in and out of a path of an ion beam along a first direction.

14. The ion implanter of claim 13, further comprising a controller connected to said plurality of drive units, said controller configured to adjust each of said plurality of blockers in said first direction.

15. The ion implanter of claim 14, wherein the scanner is configured to scan the ion beam according to a scanner waveform, wherein the controller is configured to adjust the scanner waveform in conjunction with movement of the blockers to achieve a uniform ion beam current profile.

16. The ion implanter of claim 14, wherein each of said plurality of blockers is adjusted individually by said controller.

17. The ion implanter of claim 12, wherein said plurality of blockers is formed of a conductive material.

18. The ion implanter of claim 12, wherein said plurality of blockers is connected to ground.

* * * * *